(12) United States Patent
Tsutsui et al.

(10) Patent No.: US 12,308,355 B2
(45) Date of Patent: May 20, 2025

(54) SEMICONDUCTOR DEVICE AND SEMICONDUCTOR MODULE

(71) Applicant: Murata Manufacturing Co., Ltd., Kyoto-fu (JP)

(72) Inventors: Takayuki Tsutsui, Nagaokakyo (JP); Yuichi Saito, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 762 days.

(21) Appl. No.: 17/549,615

(22) Filed: Dec. 13, 2021

(65) Prior Publication Data
US 2022/0189936 A1 Jun. 16, 2022

(30) Foreign Application Priority Data

Dec. 14, 2020 (JP) ................. 2020-206896

(51) Int. Cl.
*H03F 3/14* (2006.01)
*H01L 23/00* (2006.01)
(Continued)

(52) U.S. Cl.
CPC .............. *H01L 25/16* (2013.01); *H01L 24/08* (2013.01); *H01L 24/24* (2013.01);
(Continued)

(58) Field of Classification Search
CPC ......... H01L 25/16; H01L 24/08; H01L 24/24; H01L 24/13; H01L 2224/08145; H01L 2224/13144; H01L 2224/13147; H01L 2224/1357; H01L 2224/24105; H01L 2224/24146; H01L 2924/10253; H01L 2924/10329; H01L 2924/13091; H01L 2924/1421; H01L 24/14; H01L 2224/0603; H01L 2224/13022; H01L 28/40;
(Continued)

(56) References Cited

U.S. PATENT DOCUMENTS 5,834,975 A * 11/1998 Bartlett ................... H03F 3/211
330/307
2007/0210866 A1* 9/2007 Sato .......................... H03F 3/72
330/126

(Continued)

FOREIGN PATENT DOCUMENTS

JP  2001-053179 A  2/2001
JP  2020-136729 A  8/2020

*Primary Examiner* — Khanh V Nguyen
(74) *Attorney, Agent, or Firm* — Studebaker Brackett PLLC

(57) ABSTRACT

A semiconductor device includes first member that includes a switch made of a semiconductor element made from an elemental semiconductor. The first member is joined to a second member including a radio-frequency circuit including a semiconductor element made from a compound semiconductor. The switch and the radio-frequency circuit are connected by a path. The path includes an inter-member connection wire made of a metal pattern arranged on an interlayer insulating film extending from a surface of the second member to a surface of the first member or a conductive member allowing a current to flow in a direction crossing an interface where the first member and the second member are joined.

18 Claims, 16 Drawing Sheets

(51) Int. Cl.
  *H01L 25/16* (2023.01)
  *H03F 3/04* (2006.01)
  *H03F 3/45* (2006.01)
(52) U.S. Cl.
  CPC .......... *H03F 3/45475* (2013.01); *H01L 24/13* (2013.01); *H01L 2224/08145* (2013.01); *H01L 2224/13144* (2013.01); *H01L 2224/13147* (2013.01); *H01L 2224/1357* (2013.01); *H01L 2224/24105* (2013.01); *H01L 2224/24146* (2013.01); *H01L 2924/10253* (2013.01); *H01L 2924/10329* (2013.01); *H01L 2924/13091* (2013.01); *H01L 2924/1421* (2013.01); *H03F 2200/06* (2013.01); *H03F 2200/451* (2013.01)
(58) Field of Classification Search
  CPC ..... H01L 2223/6655; H01L 2223/6661; H01L 23/66; H01L 24/06; H01L 2223/6638; H01L 2224/0401; H01L 2224/05008; H01L 2224/051; H01L 2224/05569; H01L 2224/05644; H01L 2224/13082; H01L 2224/131; H01L 2224/1403; H01L 2224/16225; H01L 2224/48145; H01L 2224/73207; H01L 2224/81399; H01L 2224/94; H01L 2924/15192; H01L 2924/181; H01L 23/5283; H01L 2223/6644; H01L 2924/3011; H03F 3/45475; H03F 2200/06; H03F 2200/451; H03F 3/245; H03F 2200/111; H03F 2203/45551; H03F 2203/45576; H03F 1/56; H03F 2200/213; H03F 2203/45051; H03F 3/195; H03F 2200/09; H03F 2200/222; H03F 2203/45548; H03F 3/19; H03F 3/21; H03F 3/14; H03F 3/187
  USPC .................................. 330/116, 117, 275, 301
  See application file for complete search history.

(56) References Cited

U.S. PATENT DOCUMENTS

2009/0289721 A1  11/2009  Rajendran et al.
2015/0349731 A1  12/2015  Kwon et al.
2019/0296703 A1   9/2019  Ortiz et al.

\* cited by examiner

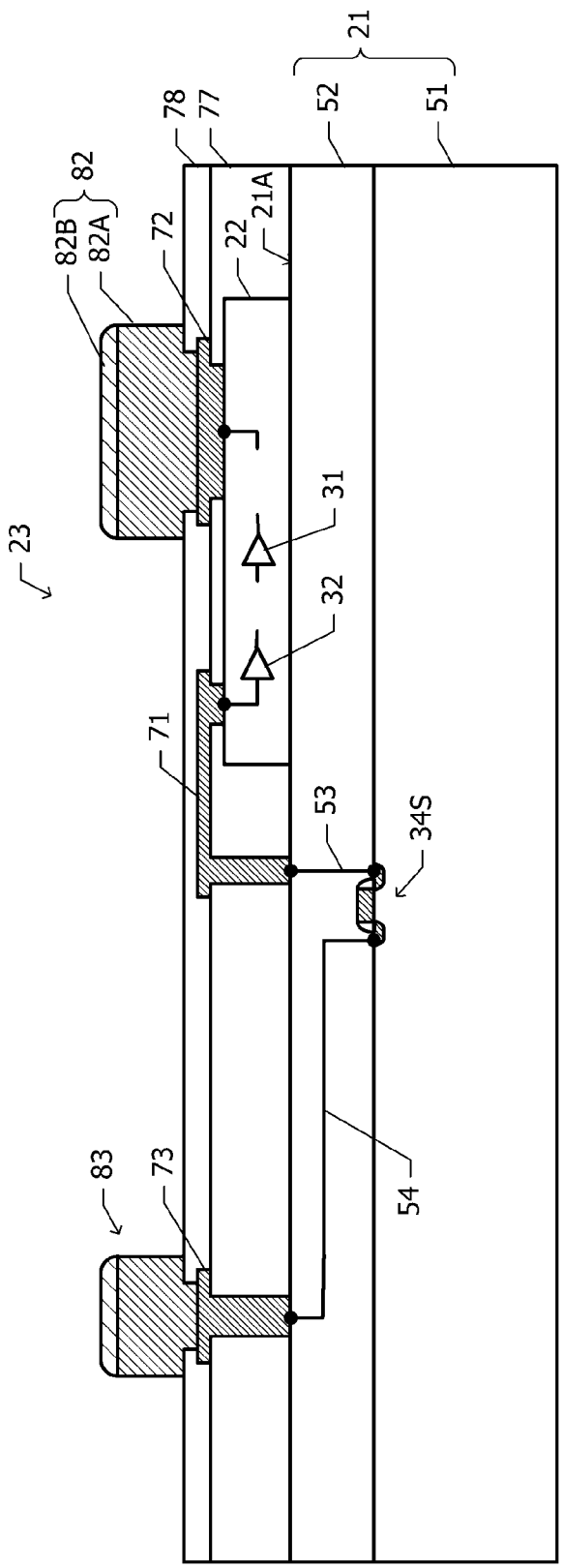

SEMICONDUCTOR DEVICE AND SEMICONDUCTOR MODULE

CROSS-REFERENCE TO RELATED APPLICATION

This application claims benefit of priority to Japanese Patent Application No. 2020-206896, filed Dec. 14, 2020, the entire content of which is incorporated herein by reference.

BACKGROUND

Technical Field

The present disclosure relates to a semiconductor device and a semiconductor module.

Background Art

One of the main components implemented in a portable terminal is a radio-frequency power amplifier. To increase the wireless transmission capacity of the portable terminal, a wireless communication protocol using many frequency bands, such as carrier aggregation (CA), is in practical use. With an increase in the number of frequency bands used, the circuit configuration of an RF front end is complicated. Moreover, the circuit configuration of the RF front end is further complicated to make the sub-6 GHz frequency bands in 5th generation mobile communication system (5G) available.

When the circuit configuration of the RF front end is complicated, the loss caused by a filter, a switch, and the like inserted in a transmission line from the radio-frequency power amplifier to an antenna is increased. Thus, for the radio-frequency power amplifier, in addition to supporting the plurality of frequency bands, an increased output is needed. A technique of combining outputs of a plurality of CMOS power amplifiers and converting impedance is disclosed in Kyu Hwan An et. al., "Power-Combining Transformer Techniques for Fully-Integrated CMOS Power Amplifiers," IEEE J. of Solid-state Circuits, vol. 43, no. 5, May 2008.

When the number of used frequency bands is increased, it is desired that the element constant of an impedance matching circuit be adjusted in accordance with the frequency band. For example, the element constant can be adjusted by turning on or off of a switch connected to a reactance element. One example component used in the radio-frequency power amplifier is a heterojunction bipolar transistor made from a compound semiconductor.

SUMMARY

To form a switch for adjusting an element constant on a semiconductor chip with the heterojunction bipolar transistor made from the compound semiconductor, for example, the use of a BiFET structure or BiHEMT structure is required. Therefore, the manufacturing process is complicated. If the switch is formed on a silicon-based semiconductor chip and the radio-frequency power amplifier is made of the semiconductor chip made from the compound semiconductor, the use of the BiFET structure or BiHEMT structure is not needed. In the configuration in which the two semiconductor chips are mounted on a module substrate, however, the dimensions of the semiconductor module are increased.

If the silicon-based semiconductor chip and the semiconductor chip made from the compound semiconductor are stacked and both are connected by a bonding wire, the semiconductor module can be downsized. When it handles radio-frequency signals, however, parasitic inductance of the bonding wire is not negligible, and desired characteristics are not obtainable.

Accordingly, the present disclosure provides a semiconductor device and a semiconductor module capable of reducing parasitic inductance in a radio-frequency circuit including a semiconductor element made from an elemental semiconductor and a semiconductor element made from a compound semiconductor.

According to an aspect of the present disclosure, a semiconductor device is provided. The semiconductor device includes a first member including a switch made of a semiconductor element made from an elemental semiconductor, a second member including a radio-frequency circuit including a semiconductor element made from a compound semiconductor, the second member joined to the first member, and a path connecting the switch and the radio-frequency circuit. The path includes an inter-member connection wire made of a metal pattern arranged on an interlayer insulating film extending from a surface of the second member to a surface of the first member or a conductive member allowing a current to flow in a direction crossing an interface where the first member and the second member are joined.

According to another aspect of the present disclosure, a semiconductor module is provided. The semiconductor module includes a semiconductor device including a first member including a switch made of a semiconductor element made from an elemental semiconductor and a second member including a radio-frequency circuit including a semiconductor element made from a compound semiconductor, the second member joined to the first member, a module substrate on which the semiconductor device is mounted, and a path connecting the switch and the radio-frequency circuit. The semiconductor device includes a first conductive protrusion connected to the switch and a second conductive protrusion connected to the radio-frequency circuit, and the path includes the first conductive protrusion, a wire disposed on the module substrate, and the second conductive protrusion.

Because the switch in the first member and the radio-frequency circuit in the second member are connected without the use of a bonding wire, an increase in parasitic inductance in a path connecting both can be suppressed.

BRIEF DESCRIPTION OF THE DRAWINGS

FIG. 2 is a schematic cross-sectional view of a semiconductor device implemented in the radio-frequency power amplifier according to the first embodiment;

DETAILED DESCRIPTION

First Embodiment

A semiconductor device according to a first embodiment is described with reference to FIGS. 1 to 7B. The semiconductor device according to the first embodiment is a radio-frequency power amplifier.

Figure 1:
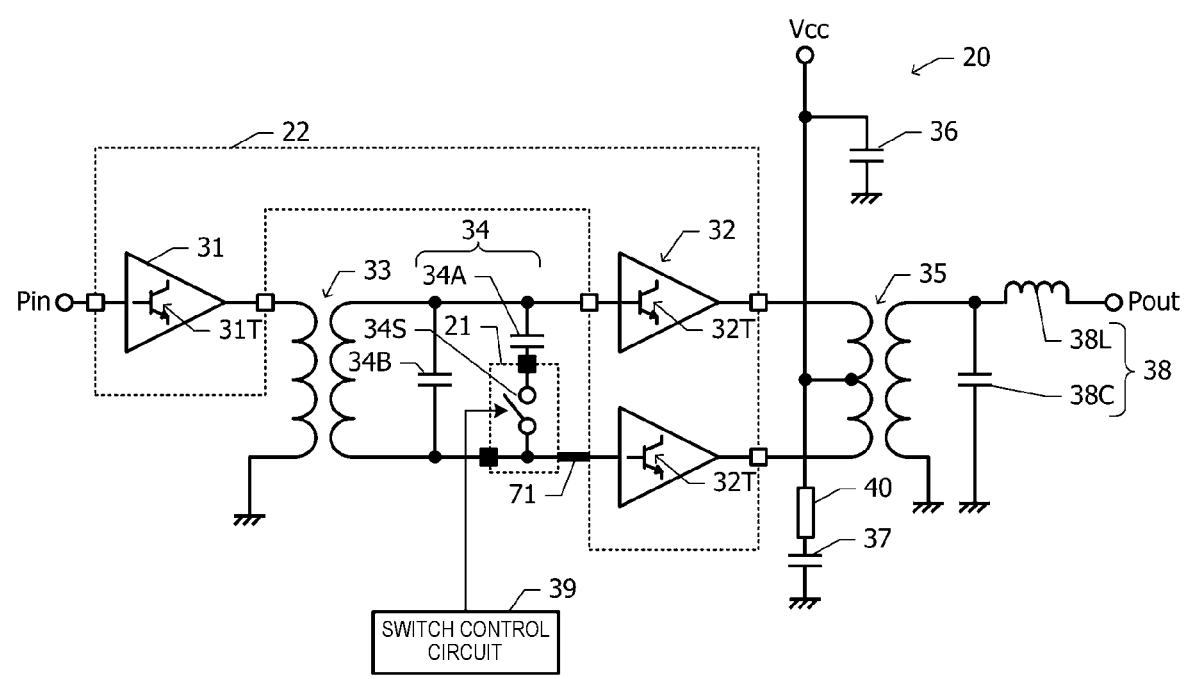
FIG. 1 is a schematic equivalent circuit diagram of a radio-frequency power amplifier according to a first embodiment.

FIG. 1 is a schematic equivalent circuit diagram of a radio-frequency power amplifier 20 according to the first embodiment. The radio-frequency power amplifier 20 according to the first embodiment includes a driver-stage amplifier circuit 31, a first balun 33, a variable capacitance circuit 34, a power-stage differential amplifier circuit 32, a second balun 35, an output matching circuit 38, and a switch control circuit 39. The driver-stage amplifier circuit 31 includes at least one transistor 31T. The power-stage differential amplifier circuit 32 includes a plurality of transistors 32T connected in parallel with each other. The driver-stage amplifier circuit 31 amplifies a single-end signal input from an input terminal Pin.

The first balun 33 includes a primary coil and a secondary coil and converts a single-end signal into a differential signal. Specifically, one end of the primary coil is connected to an output port of the driver-stage amplifier circuit 31, and the other end is connected to a ground. Both ends of the secondary coil are connected to two input ports of the power-stage differential amplifier circuit 32, respectively, with differential transmission lines disposed therebetween.

The variable capacitance circuit 34 is connected between a pair of wires allowing transmission of a differential signal to be input into the power-stage differential amplifier circuit 32 therethrough. The variable capacitance circuit 34 includes capacitors 34A and 34B connected in parallel with each other and a switch 34S connected in series with the capacitor 34A.

The second balun 35 includes a primary coil and a secondary coil and converts a differential signal output from the power-stage differential amplifier circuit 32 into a single-end signal. Both ends of the primary coil are connected to two output ports of the power-stage differential amplifier circuit 32, respectively. A power supply voltage Vcc is applied to a center tap of the primary coil, and power is supplied to the power-stage differential amplifier circuit 32 through the primary coil. A power supply line is connected to a decoupling capacitor 36 in order to prevent oscillation, suppress noise, obtain linearity during modulation, and the like. The center tap of the primary coil is grounded with a DC cut capacitor 37 disposed therebetween in terms of radio frequencies. In FIG. 1, an inductance possessed by the wire is expressed as an inductor 40. A resonance circuit including the DC cut capacitor 37 and the inductor 40 functions as a filter for suppressing harmonic waves, including a second harmonic wave and a third harmonic wave, of radio-frequency signals. The DC cut capacitor 37 and the inductor 40 are not used as the filter in some cases. In such cases, the DC cut capacitor 37 functions only as a capacitor for DC cutting.

A single-end signal converted from a differential signal by the second balun 35 is output through the output matching circuit 38 from an output terminal Pout. The output matching circuit 38 includes an inductor 38L connected in series with a load and a capacitor 38C connected in parallel with the load and the inductor 38L.

The switch control circuit 39 controls the turning on and off of the switch 34S in accordance with the frequency of a radio-frequency signal to be amplified. When the on or off state of the switch 34S is switched, the capacitance of the variable capacitance circuit 34 is changed. In that way, impedance matching suited for frequencies can be performed.

The radio-frequency power amplifier 20 according to the first embodiment includes a semiconductor device 23 including a first member 21 and a second member 22 and a module substrate 25 (FIG. 4) on which the semiconductor device 23 is mounted, as described below with reference to the drawings of FIGS. 2 to 4. The driver-stage amplifier circuit 31 and the power-stage differential amplifier circuit 32 are disposed in the second member 22. The switch 34S is disposed in the first member 21. The first balun 33, the capacitors 34A and 34B, the second balun 35, the decoupling capacitor 36, the DC cut capacitor 37, and the output matching circuit 38 are passive circuit components of the surface mount type mounted on the module substrate 25 (FIG. 4).

The solid squares and hollow squares illustrated in FIG. 1 indicate connections to the module substrate 25 with conductive protrusions disposed on the first member 21 and conductive protrusions disposed on the second member 22, respectively, disposed therebetween. The thicker solid line illustrated in FIG. 1 indicates that circuit disposed in the first member 21 and circuit disposed in the second member 22 described below are connected by a connection wire between members (hereinafter referred to as inter-member connection wire) 71 included in a redistribution layer.

FIG. 2 is a schematic cross-sectional view of the semiconductor device 23 implemented in the radio-frequency power amplifier 20 according to the first embodiment. In FIG. 2, the driver-stage amplifier circuit 31 and the power-stage differential amplifier circuit 32 are expressed by circuit diagram symbols, and the wires and vias in a multilayer wiring structure are expressed by the lines. Those wires include metal patterns inside wiring layers and vias connecting the wiring layers in actuality.

The semiconductor device 23 in the radio-frequency power amplifier according to the first embodiment includes the first member 21 and the second member 22. For example, the first member 21 may be made from an elemental semiconductor, and the second member 22 may be made from a compound semiconductor. The first member 21 includes a semiconductor region made from an elemental semiconductor. For example, the first member 21 may include a semiconductor substrate 51 and a multilayer wiring structure 52 arranged on one surface thereof. As the semiconductor substrate 51, a substrate made from an elemental semiconductor, such as a silicon substrate or a silicon on insulator (SOI) substrate, can be used. The first member 21 includes the switch 34S and the like made of a semiconductor element made from an elemental semiconductor, for example, a MOSFET, disposed in a surface layer portion in the semiconductor substrate 51.

The second member 22 is in surface contact with and is joined to a surface of the multilayer wiring structure 52 (hereinafter referred to as "first surface 21A"). The second member 22 includes a semiconductor region made from a compound semiconductor. The structure of the second member 22 is described in detail below with reference to FIG. 3.

The second member 22 includes the driver-stage amplifier circuit 31 and the power-stage differential amplifier circuit 32. An interlayer insulating film 77 is arranged so as to cover the first surface 21A of the first member 21 and the second member 22. The interlayer insulating film 77 has a planarized upper surface. The inter-member connection wire 71, pads 72 and 73, and the like made of metal patterns are arranged on the interlayer insulating film 77.

The pad 72 extends through a cavity in the interlayer insulating film 77 and is connected to an emitter of each of the transistors 32T (FIG. 1) in the power-stage differential amplifier circuit 32. The other pad 73 extends through a cavity in the interlayer insulating film 77 and is connected to the switch 34S with a wire 54 inside the multilayer wiring structure 52 disposed therebetween. The inter-member connection wire 71 extends through a cavity in the interlayer insulating film 77 and is connected to the power-stage differential amplifier circuit 32, and it extends through another cavity in the interlayer insulating film 77 and is connected to the switch 34S with a wire 53 inside the multilayer wiring structure 52 disposed therebetween.

A wiring layer where the inter-member connection wire 71, the pads 72 and 73, and the like are arranged may be referred to as a redistribution layer. A protective film 78 with insulating properties is arranged on the interlayer insulating film 77 so as to cover the redistribution layer. The protective film 78 has cavities contained in the pads 72 and 73 and the like, respectively, as seen in plan view. Conductive protrusions 82 and 83 are arranged on the pads 72 and 73 exposed inside the cavities, respectively. The conductive protrusions 82 and 83 is raised above the upper surface of the protective film 78 and expand to the upper surface of the protective film 78 in the vicinity of the cavities.

The conductive protrusion 82 includes a copper (Cu) pillar 82A connected to the pad 72 and a solder layer 82B arranged on an upper surface of the Cu pillar 82A. The conductive protrusion 82 of that structure is called a Cu pillar bump. An under bump metal layer may be arranged on a bottom surface of the Cu pillar 82A in order to improve the close contact. The other conductive protrusion 83 has the same laminate structure as that of the conductive protrusion 82. In place of the Cu pillar bump, other elements, such as a gold (Au) bump, a solder ball bump, and a conductive support (conductive pillar) standing on the pad, may be used in the conductive protrusions 82 and 83 and the like. A bump without a solder layer formed thereon, such as a Au bump, may also be called a pillar. The conductive support standing on a pad may also be called a post.

A ground conductor inside the second member 22 and a ground conductor inside the first member 21 are connected to each other by a re-wire (not expressed in the cross section in FIG. 2) inside the redistribution layer. Moreover, the ground conductor inside the second member 22 and the ground conductor inside the first member 21 are connected to a shared ground conductor in the module substrate with the conductive protrusion disposed on the first member 21 and the conductive protrusion disposed on the second member 22 disposed therebetween, respectively. The switch 34S disposed in the first member 21 is connected to the capacitor 34A (FIG. 1) mounted on the module substrate with the conductive protrusion 83 disposed therebetween.

Figure 3A:
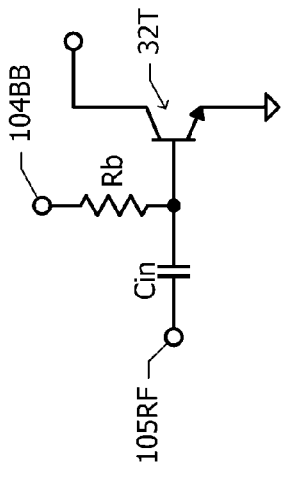
FIG. 3A is an equivalent circuit diagram of a single cell included in a power-stage differential amplifier circuit disposed in a second member.
Figure 4:
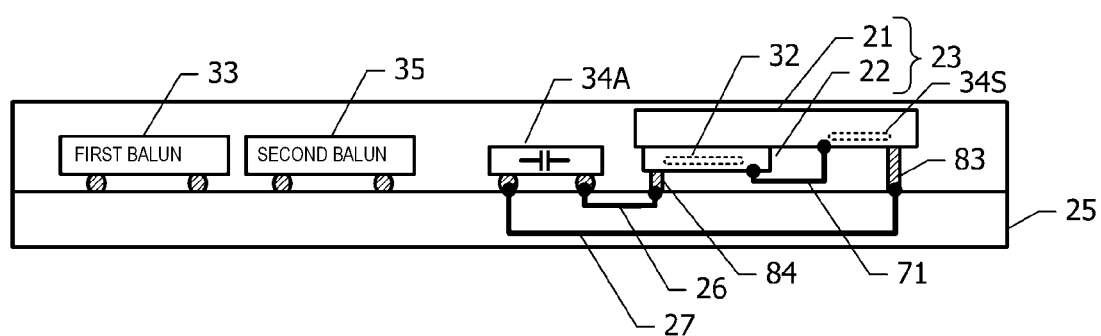
FIG. 4 is a schematic cross-sectional view of a radio-frequency power module according to the first embodiment.

FIG. 3A is an equivalent circuit diagram of a single cell included in the power-stage differential amplifier circuit 32 (FIG. 1) disposed in the second member 22. The power-stage differential amplifier circuit 32 includes a plurality of cells connected in parallel with each other. Each of the cells includes the transistor 32T, an input capacitor Cin, and a ballast resistor element Rb. The base of the transistor 32T is connected to a radio-frequency signal input wire 105RF with the input capacitor Cin disposed therebetween. Moreover, the base of the transistor 32T is connected to a base bias wire 104BB with the ballast resistor element Rb disposed therebetween. The emitter of the transistor 32T is grounded. A power supply voltage is applied to the collector of the transistor 32T, and an amplified radio-frequency signal is output from the collector.

Figure 3B:
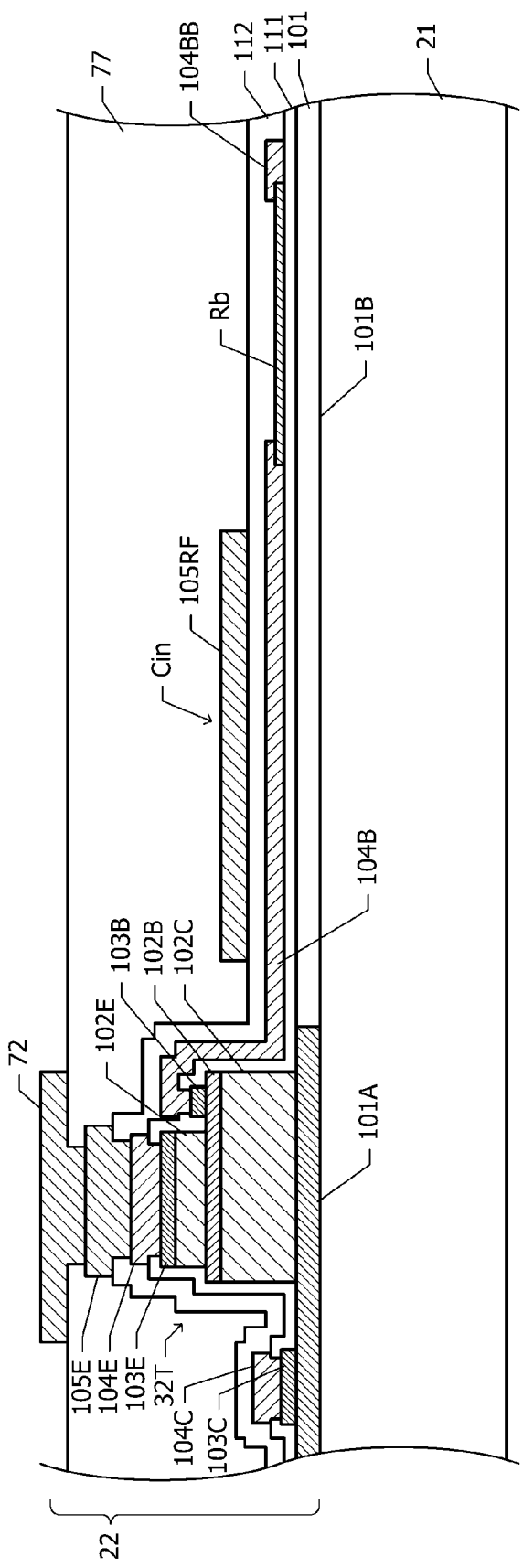
FIG. 3B is a cross-sectional view of the single cell included in the power-stage differential amplifier circuit disposed in the second member.

FIG. 3B is a schematic cross-sectional view of the single cell included in the power-stage differential amplifier circuit 32 disposed in the second member 22. The second member 22 includes a base semiconductor layer 101. The base semiconductor layer 101 is in surface contact with the first member 21, and thus the second member 22 is joined to the first member 21. The base semiconductor layer 101 is divided into a conductive region 101A and an element separation region 101B. One example material used in the base semiconductor layer 101 may be gallium arsenide (GaAs). The conductive region 101A is made of n-type GaAs, and the element separation region 101B is formed by introducing insulation impurities into an n-type GaAs layer by ion implantation.

The transistor 32T is arranged on the conductive region 101A. The transistor 32T includes a collector layer 102C, a base layer 102B, and an emitter layer 102E, which are laminated in sequence from the conductive region 101A. The emitter layer 102E is arranged on a partial region of the base layer 102B. In one example, the collector layer 102C may be made of n-type GaAs, the base layer 102B may be made of p-type GaAs, and the emitter layer 102E may be made of n-type indium gallium phosphide (InGaP). That is, the transistor 32T is a heterojunction bipolar transistor.

A base electrode 103B is arranged on the base layer 102B. The base electrode 103B is electrically connected to the base layer 102B. An emitter electrode 103E is arranged on the emitter layer 102E. The emitter layer 102E is electrically connected to the emitter electrode 103E. A collector electrode 103C is arranged on the conductive region 101A. The collector electrode 103C is electrically connected to the collector layer 102C with the conductive region 101A disposed therebetween.

An interlayer insulating film 111 as the first layer is arranged on the base semiconductor layer 101 so as to cover the transistor 32T, the collector electrode 103C, the base electrode 103B, and the emitter electrode 103E. The interlayer insulating film 111 as the first layer may be made of an inorganic insulating material, such as SiN. The interlayer insulating film 111 has a plurality of cavities.

An emitter wire 104E, a base wire 104B, and a collector wire 104C, as the first layer, and the base bias wire 104BB are arranged on the interlayer insulating film 111. Moreover, the ballast resistor element Rb is arranged on the interlayer insulating film 111. The emitter wire 104E extends through a cavity in the interlayer insulating film 111 and is connected to the emitter electrode 103E. The base wire 104B extends through another cavity in the interlayer insulating film 111 and is connected to the base electrode 103B. The collector wire 104C extends through another cavity in the interlayer insulating film 111 and is connected to the collector electrode 103C.

The base wire 104B extends to a region where the transistor 32T is not arranged, and its leading end overlaps one end portion of the ballast resistor element Rb. In that overlapping portion, the base wire 104B and the ballast resistor element Rb are electrically connected. The other end portion of the ballast resistor element Rb overlaps the base bias wire 104BB. In that overlapping portion, the ballast resistor element Rb and the base bias wire 104BB are electrically connected.

An interlayer insulating film 112 as the second layer is arranged on the interlayer insulating film 111 so as to cover the emitter wire 104E, and base wire 104B, as the first layer, and base bias wire 104BB, and the ballast resistor element Rb. The interlayer insulating film 112 as the second layer is also made of an inorganic insulating material, such as SiN.

An emitter wire 105E as the second layer and the radio-frequency signal input wire 105RF are arranged on the interlayer insulating film 112. The emitter wire 105E as the second layer extends through a cavity in the interlayer insulating film 112 and is connected to the emitter wire 104E as the first layer. A portion of the radio-frequency signal input wire 105RF overlaps the base wire 104B as the first layer in plan view. The input capacitor Cin is formed in their overlapping region.

The interlayer insulating film 77 as the third layer is arranged on the emitter wire 105E as the second layer and the radio-frequency signal input wire 105RF. One example of the interlayer insulating film 77 as the third layer may be made of an organic insulating material, such as polyimide. The interlayer insulating film 77 as the third layer expands to the top of the first member 21, as illustrated in FIG. 2.

The pad 72 is arranged on the interlayer insulating film 77 as the third layer. The pad 72 extends through a cavity in the interlayer insulating film 77 and is connected to the emitter wire 105E as the second layer.

FIG. 4 is a schematic cross-sectional view of the radio-frequency power amplifier 20 according to the first embodiment. The semiconductor device 23, the capacitor 34A, the first balun 33, the second balun 35, and the like are mounted on a component mounting surface of the module substrate 25. The semiconductor device 23 is mounted in an attitude in which the surface of the first member 21 where the second member 22 is joined faces the module substrate 25.

The switch 34S is disposed in the first member 21 in the semiconductor device 23, and the power-stage differential amplifier circuit 32 is disposed in the second member 22. One input port of the power-stage differential amplifier circuit 32 (FIG. 1) is connected to one contact of the switch 34S in the first member 21 with the inter-member connection wire 71 disposed therebetween. The other contact of the switch 34S is connected to one terminal of the capacitor 34A with the conductive protrusion 83 on the first member 21 and a wire 27 inside the module substrate 25 disposed therebetween. The other terminal of the capacitor 34A is connected to the other input port of the differential amplifier circuit 32 with a wire 26 inside the module substrate 25 and a conductive protrusion 84 disposed on the second member 22 disposed therebetween.

Next, a method for manufacturing the semiconductor device 23 (FIG. 2) implemented in the radio-frequency power amplifier according to the first embodiment is described with reference to the drawings of FIGS. 5A to 6D. The drawings of FIGS. 5A to 6C are cross-sectional views of the semiconductor devices 23 in the process of manufacture, and FIG. 6D is a cross-sectional view of the semiconductor devices 23 in finished form.

Figure 5A:
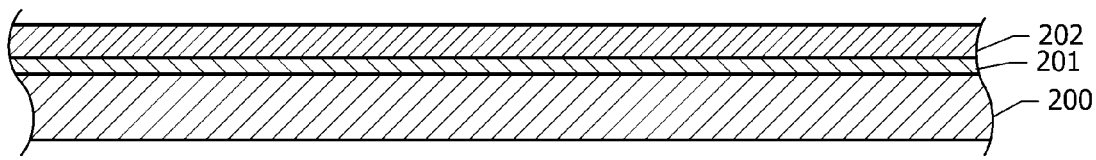
FIGS. 5A to 5F are cross-sectional views of the semiconductor devices in the process of manufacture.

As illustrated in FIG. 5A, a release layer 201 is epitaxially grown on a single-crystal base substrate 200 made from a compound semiconductor, such as GaAs, and an element formation layer 202 is formed on the release layer 201. The transistors 32T in the second member 22, the wiring layer as the first layer, the wiring layer as the second layer, and the like illustrated in FIG. 3 are formed on the element formation layer 202. Those circuit elements and wiring layers are formed by a typical semiconductor process. In FIG. 5A, the element structure formed on the element formation layer 202 is omitted. At that stage, the element formation layer 202 is not yet separated into the individual second members 22.

Figure 5B:
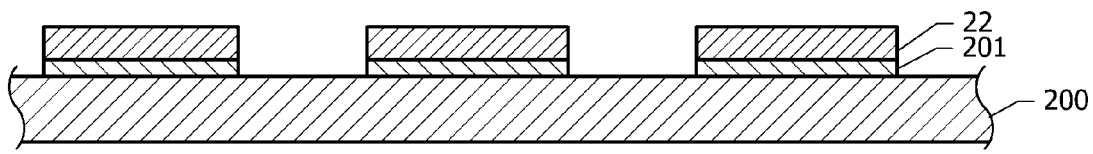

Next, as illustrated in FIG. 5B, the element formation layer 202 (FIG. 5A) and the release layer 201 are subjected to patterning by using a resist pattern (not illustrated) as an etch mask. At that stage, the element formation layer 202 (FIG. 5A) is separated into the second members 22.

Figure 5C:
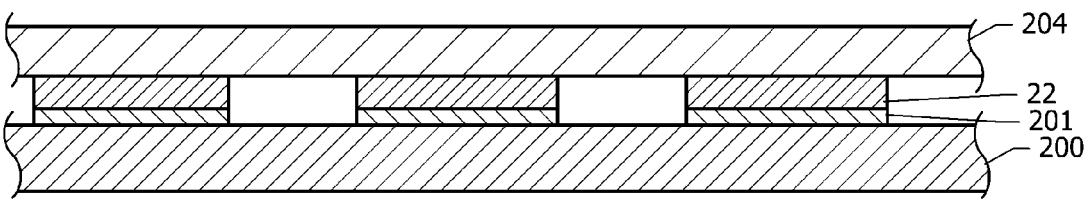

Next, as illustrated in FIG. 5C, a joining support 204 is attached to the separated second members 22. In that way, the plurality of second members 22 are joined to each other with the joining support 204 disposed therebetween. The resist pattern used as the etch mask in the patterning step in FIG. 5B may be made to remain so that the resist pattern is present between the second members 22 and the joining support 204.

Figure 5D:
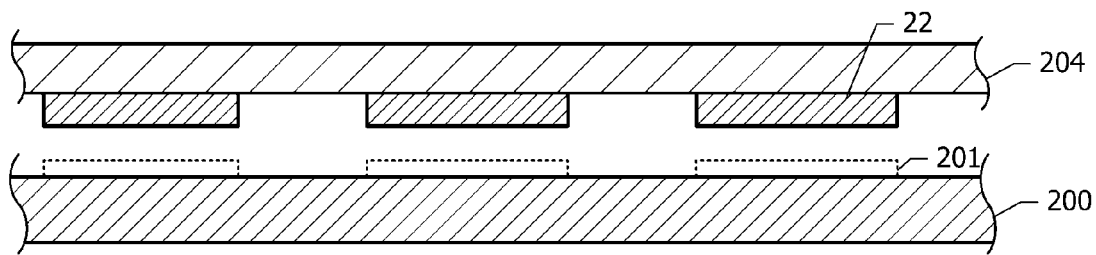

Next, as illustrated in FIG. 5D, the release layer 201 is selectively etched for the base substrate 200 and the second members 22. In that way, the second members 22 and the joining support 204 are released from the base substrate 200. To selectively etch the release layer 201, as the release layer 201, a compound semiconductor having etching tolerance different from that of the base substrate 200 and that of the second member 22 is used.

Figure 5E:
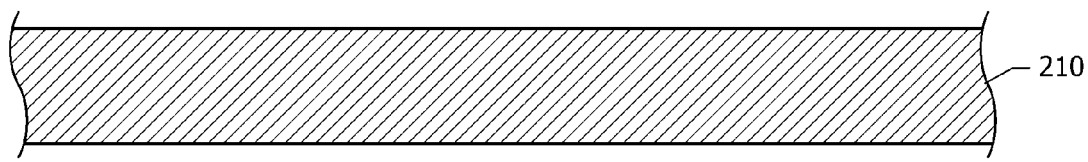

As illustrated in FIG. 5E, a substrate 210 with the switch 34S and the multilayer wiring structure 52 (FIG. 2) disposed in the first member 21 (FIG. 2), and the like is prepared. At that stage, the substrate 210 is not yet separated into the individual first members 21.

Figure 5F:
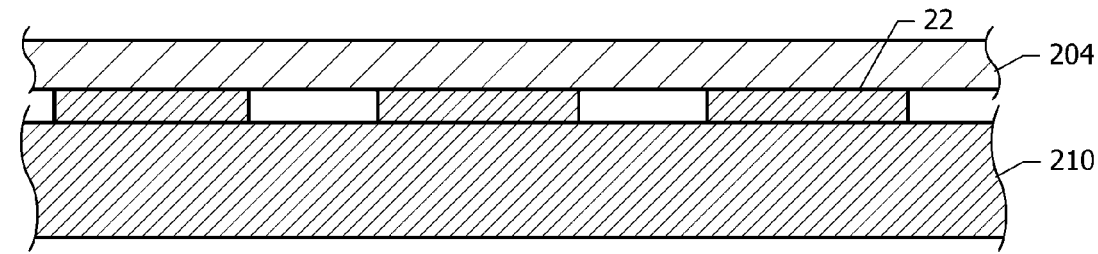

As illustrated in FIG. 5F, the second members 22 are joined to the substrate 210. The second members 22 and the substrate 210 can be joined by the Van der Waals coupling or hydrogen bonding. The second members 22 may be joined to the substrate 210 by other methods, for example, static electricity, covalent bonding, or eutectic alloy bonding. For example, if the surface of the substrate 210 is made of Au in part, the substrate 210 and the second members 22 may be joined together by bring the second members 22 into close contact with the Au region and applying pressure thereon.

Figure 6A:
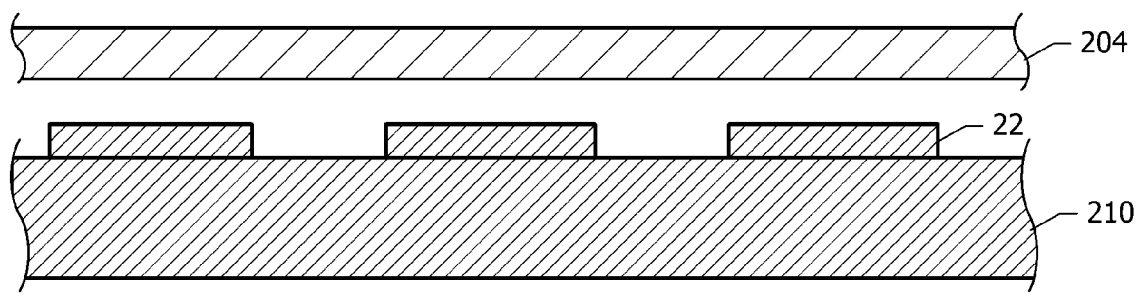
FIGS. 6A to 6C are cross-sectional views of the semiconductor devices in the process of manufacture.
Figure 6B:
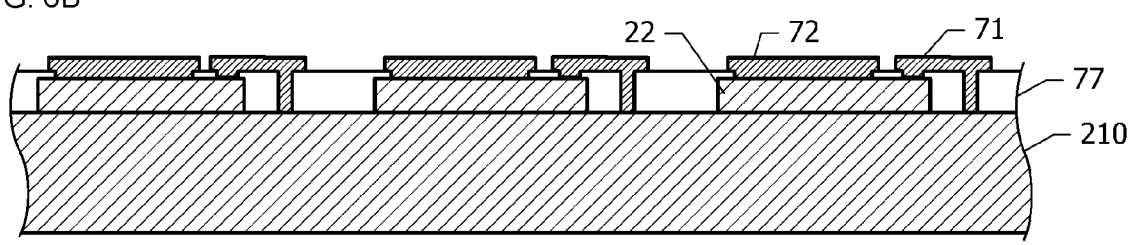

Next, as illustrated in FIG. 6A, the joining support 204 is released from the second members 22. After the joining support 204 is released, as illustrated in FIG. 6B, the interlayer insulating film 77 and the redistribution layer are formed on the substrate 210 and the second members 22. The redistribution layer includes the inter-member connection wire 71, the pads 72 and 73 (FIG. 2), and the like.

Figure 6C:
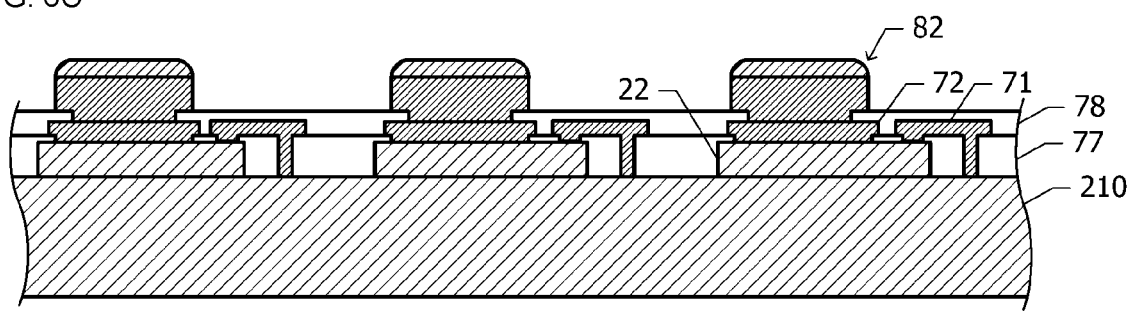
Figure 6D:
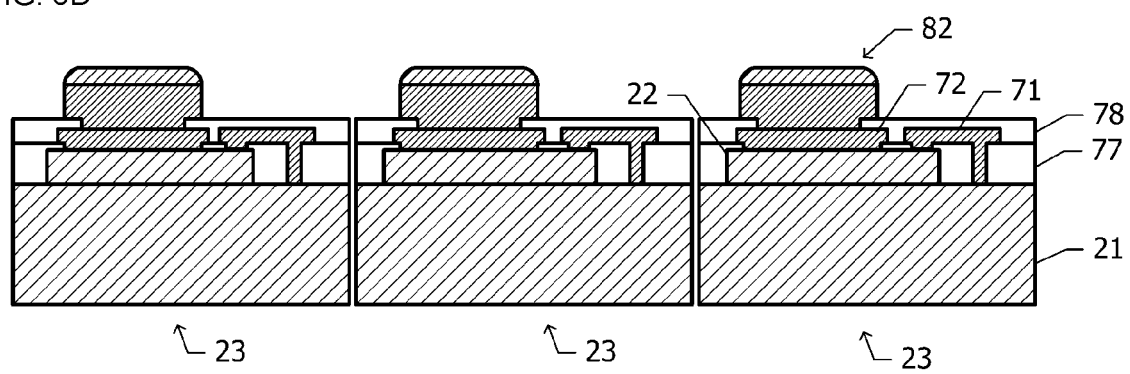
FIG. 6D is a cross-sectional view of the semiconductor devices in finished form.

Next, as illustrated in FIG. 6C, the protective film 78 is formed on the redistribution layer, and cavities are formed in predetermined positions in the protective film 78. After that, the conductive protrusions 82 are formed inside the cavities and on the protective film 78. Simultaneously with the forming of the conductive protrusions 82, the other conductive protrusions 83 (FIG. 4), conductive protrusions 84 (FIG. 4), and the like are formed.

Lastly, as illustrated in FIG. 6D, the substrate 210 is cut with a dicing machine. In that way, the semiconductor devices 23 are obtained. The first member 21 in each of the singulated semiconductor devices 23 is larger than the second member 22 as seen in plan view.

Next, advantageous effects of the first embodiment are described.

In the first embodiment, impedance matching suited for each of the frequency bands can be performed by changing the capacitance of the variable capacitance circuit 34 (FIG. 1) in accordance with the frequency bands.

Moreover, in the first embodiment, the switch 34S (FIG. 2) made of a MOSFET is arranged in the first member 21 including the semiconductor substrate 51 made from an elemental semiconductor, and the power-stage differential amplifier circuit 32 including the transistors 32T (FIGS. 3A and 3B) made from a compound semiconductor is arranged in the second member 22. Because the switch 34S is not arranged in the second member 22, it is not necessary to use a BiFET structure or a BiHEMT structure in the second member 22. Therefore, complication of the process of manufacturing the second member 22 is avoided, and an increase in the manufacturing cost can be suppressed.

Moreover, in the first embodiment, the second member 22 is joined to the first member 21, and they are mounted as the single semiconductor device 23 on the module substrate 25. Therefore, in comparison with a configuration in which a semiconductor chip made from a compound semiconductor and a semiconductor chip made from an elemental semiconductor are independently mounted on the module substrate 25, the radio-frequency power amplifier can be more downsized.

Next, advantageous effects achieved by connecting the power-stage differential amplifier circuit 32 and the switch 34S (FIG. 2) by a path made from a conductor including the inter-member connection wire 71 (FIG. 2) in the redistribution layer and the wire 53 (FIG. 2) inside the multilayer wiring structure 52 are described with reference to FIGS. 7A and 7B. For example, radio-frequency currents flow through that path. In that case, the path made from the conductor functions as "current path." The switch 34S may be disposed in a location where almost no current flows when the switch 34S is turned on. For example, when the switch 34S is turned on, a radio-frequency voltage signal is mainly transmitted through the switch 34S. In either case, the path made from the conductor functions as a signal path for allowing radio-frequency signals to be transmitted therethrough.

In a known semiconductor device having a structure where a semiconductor chip made from an elemental semiconductor and a semiconductor chip made from a compound semiconductor are stacked, a configuration where the two stacked semiconductor chips are connected by a bonding wire is typically used. When the power-stage differential amplifier circuit 32 in the second member 22 and the switch 34S in the first member 21 are connected by the bonding wire, the influence of parasitic inductance possessed by the bonding wire is not negligible. In the equivalent circuit diagram illustrated in FIG. 1, in an on state of the switch 34S, parasitic inductance is inserted in series with the capacitor 34A.

To estimate the influence of the parasitic inductance, a scattering (S) parameter S21 of the capacitor 34A (FIG. 1) in the on state of the switch 34S for the case where the parasitic inductance is present and the case where it is absent was determined.

Figure 7A:
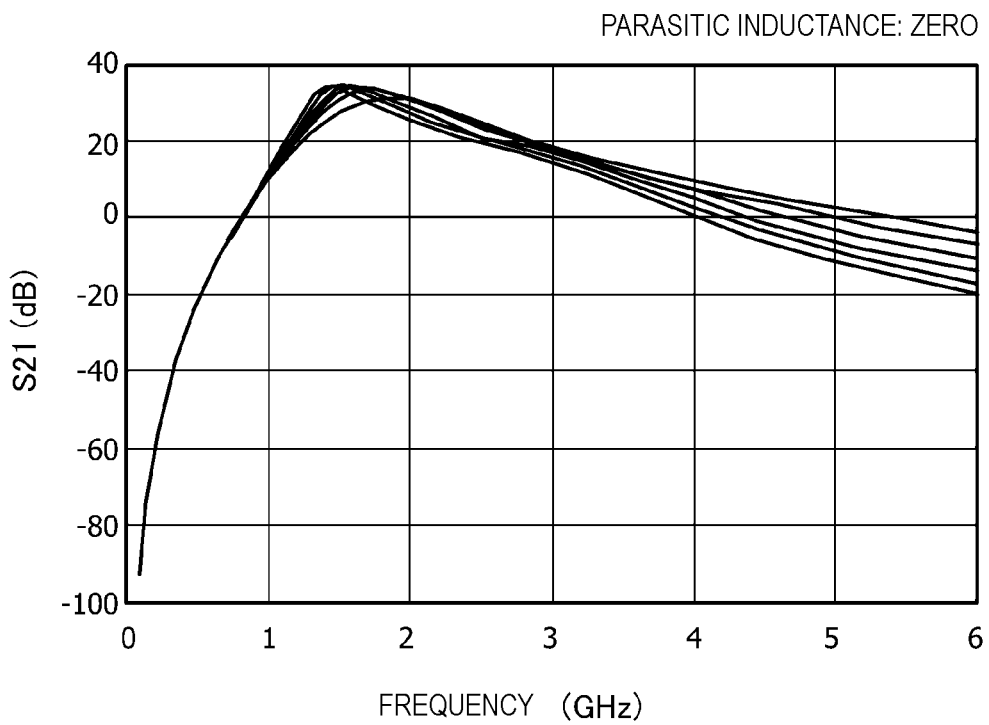
FIGS. 7A and 7B are graphs illustrating results of simulation under the condition that parasitic inductance of a variable capacitance circuit is zero and the condition that the parasitic inductance is 2 nH, respectively.
Figure 7B:
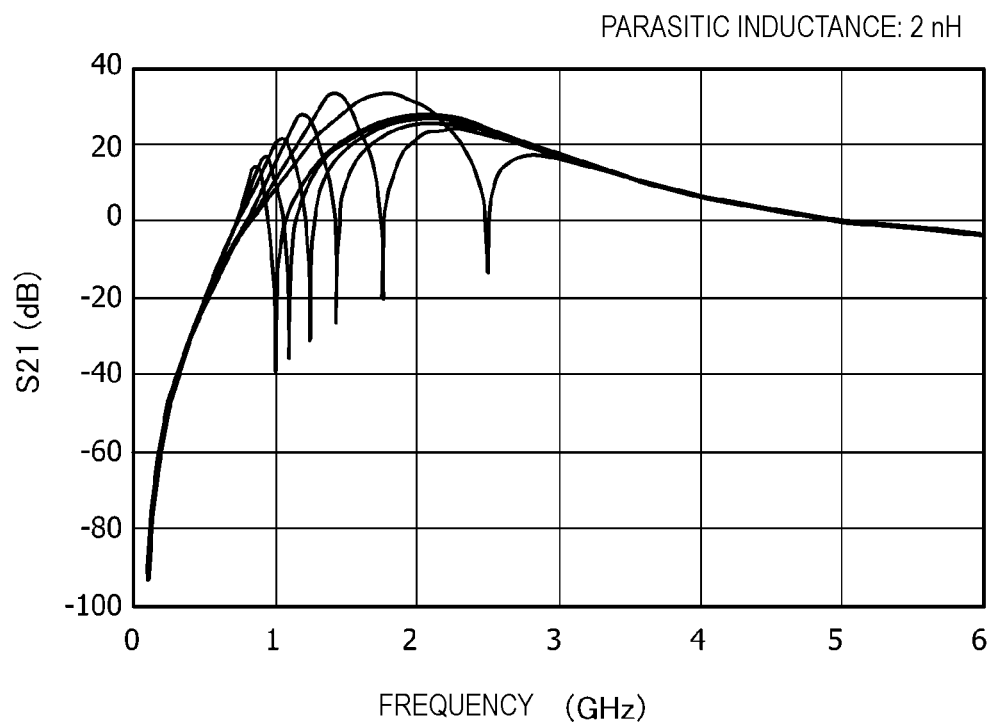

FIGS. 7A and 7B are graphs illustrating results of simulation under the condition that the parasitic inductance is zero and the condition that the parasitic inductance is 2 nH, respectively. The horizontal axis indicates the frequency in GHz, and the vertical axis indicates the parameter S21 in dB. The six curves illustrated in FIGS. 7A and 7B indicate the parameter S21 when the capacitor 34A is 2 pF, 4 pF, 6 pF, 8 pF, 10 pF, and 12 pF.

It is revealed that when the parasitic inductance is 2 nH, resonance of the LC series circuit occurs. In such cases, when the parasitic inductance becomes large to such an extent that it is not negligible, designed impedance conversion is difficult. In the first embodiment, the power-stage differential amplifier circuit 32 and the switch 34S are connected by the path including the inter-member connection wire 71 on the redistribution layer and the wire 53 inside the multilayer wiring structure 52 without the use of the bonding wire. Therefore, the increase in parasitic inductance inserted in series with the capacitor 34A can be suppressed.

In the first embodiment (FIG. 2), because the second member 22 is in surface contact with the first member 21, the thermal resistance of the heat transfer path from the transistors 32T (FIG. 1) arranged in the second member 22 to the first member 21 is low. The heat generated in the transistors 32T is transferred through the interface between the first member 21 and the second member 22 to the first member 21. The heat transferred to the first member 21 diffuses inside the first member 21 and dissipates through the surface of the first member 21 to the outside. Because the first member 21 itself has larger heat capacity than that of the second member 22, the first member 21 functions as a heatsink.

To improve the characteristic of heat dissipation through the first member 21, it is preferable that a semiconductor material having thermal conductivity higher than that of the compound semiconductor material of the transistors 32T be used in the semiconductor region of the first member 21, for example, in the semiconductor substrate 51 (FIG. 2). For example, an elemental semiconductor, such as silicon or germanium, may preferably be used in the semiconductor region of the first member 21.

Moreover, in the first embodiment (FIG. 2), the heat generated in the transistors 32T is transferred through the pad 72 and the conductive protrusion 82 (FIG. 2) to the module substrate 25 (FIG. 4). In that way, because the two paths of the heat transfer path from the transistors 32T to the first member 21 and the heat transfer path through the conductive protrusion 82 to the module substrate 25 are present, the effect of suppressing a temperature increase in the transistors 32T can be enhanced.

Next, a modification example of the first embodiment is described with reference to FIG. 8.

Figure 8:
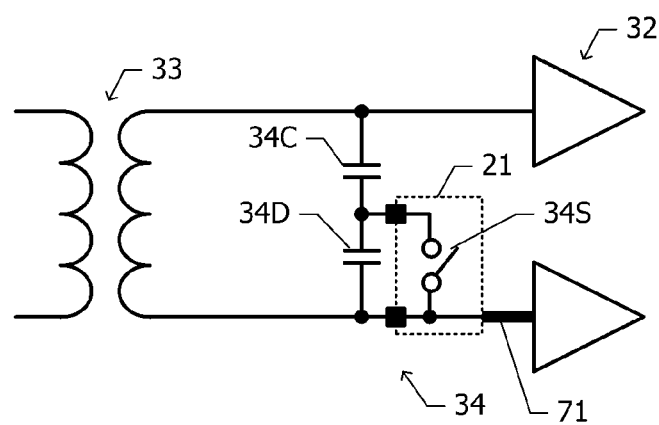
FIG. 8 is an equivalent circuit diagram of a variable capacitance circuit used in a radio-frequency power amplifier according to a modification example of the first embodiment.

FIG. 8 is an equivalent circuit diagram of the variable capacitance circuit 34 used in the radio-frequency power amplifier 20 according to the modification example of the first embodiment. In the first embodiment, the two capacitors 34A and 34B included in the variable capacitance circuit 34 are connected in parallel with each other. In contrast to this, in the modification example illustrated in FIG. 8, two capacitors 34C and 34D included in the variable capacitance circuit 34 are connected in series with each other. The switch 34S is connected in parallel with the capacitor 34D.

In the present modification example, the switch 34S and one input port of the power-stage differential amplifier circuit 32 are connected to each other with the inter-member connection wire 71 in the redistribution layer disposed therebetween, and the bonding wire is not used. In the present modification example, the capacitance of the variable capacitance circuit 34 can be changed by switching on or off of the switch 34S. Various circuit configurations including a switch and a plurality of capacitors and in which the capacitance is changed by switching on or off of the switch can be used as the variable capacitance circuit 34.

In the above first embodiment, the example in which the semiconductor device is the radio-frequency power amplifier is described. The technical idea of the above embodiment can be applied to various radio-frequency circuit devices, other than the radio-frequency power amplifier. For example, when the switch acting on the radio-frequency circuit including the semiconductor element made from the compound semiconductor in the second member 22 is formed in the first member 21, the radio-frequency circuit inside the second member 22 and the switch in the first member 21 may be connected to each other with the inter-member connection wire 71 inside the redistribution layer disposed therebetween. In that case, the parasitic inductance inserted in series with the switch can be reduced.

Second Embodiment

Next, a radio-frequency power amplifier according to a second embodiment is described with reference to FIG. 9. The description of the configuration common to the radio-frequency power amplifier according to the first embodiment described with reference to the drawings of FIGS. 1 to 7B is omitted below.

Figure 9:
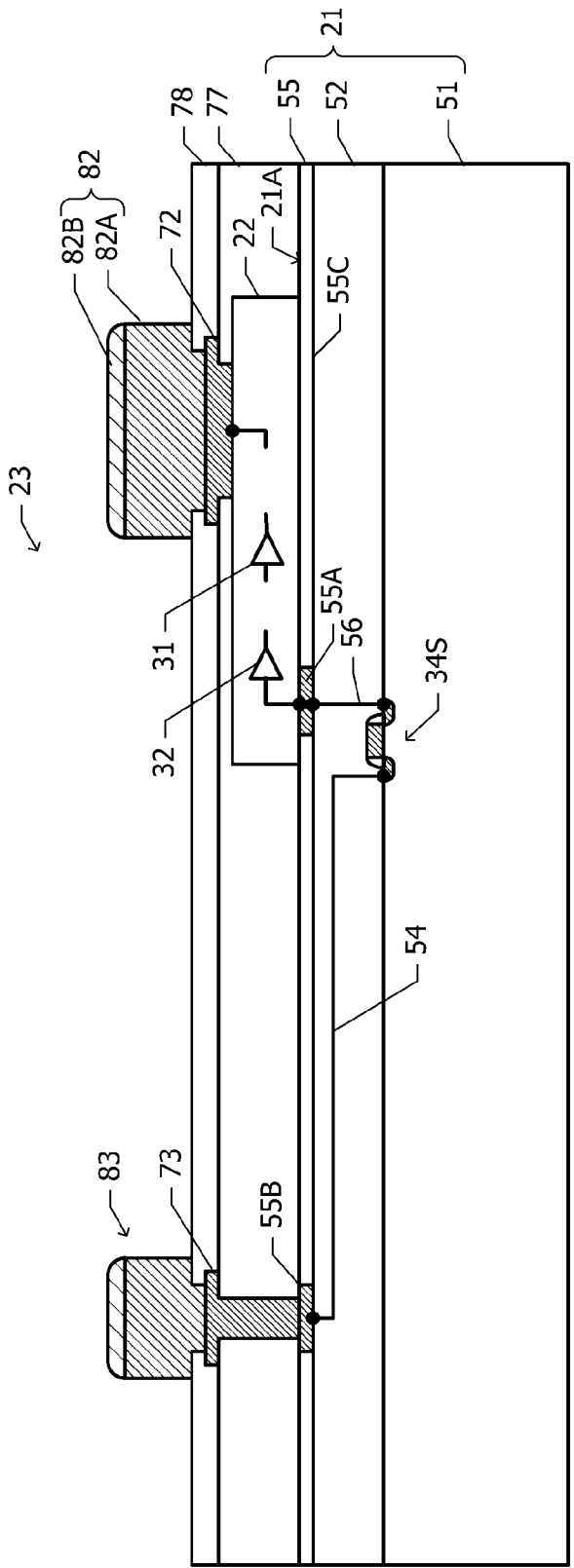
FIG. 9 is a schematic cross-sectional view of a semiconductor device implemented in a radio-frequency power amplifier according to a second embodiment.

FIG. 9 is a schematic cross-sectional view of the semiconductor device 23 implemented in the radio-frequency power amplifier according to the second embodiment. In the first embodiment (FIG. 2), the switch 34S in the first member 21 and the power-stage differential amplifier circuit 32 in the second member are connected to each other with the inter-member connection wire 71 inside the redistribution layer disposed therebetween. In contrast to this, in the second embodiment, the switch 34S and the power-stage differential amplifier circuit 32 are connected to each other with the path including a conductive member allowing currents to flow in a direction crossing the interface where the first member 21 and the second member 22 are joined.

The first member 21 includes, in addition to the semiconductor substrate 51 and the multilayer wiring structure 52, a bonding layer 55 arranged on the upper surface of the multilayer wiring structure 52. The bonding layer 55 is divided into a plurality of metal regions 55A and 55B and an insulating region 55C. The insulating region 55C electrically isolates the plurality of metal regions 55A and 55B and the like. The metal region 55A is connected to one input port of the power-stage differential amplifier circuit 32 inside the second member 22. The metal region 55A is connected to the switch 34S with a wire 56 inside the multilayer wiring structure 52 disposed therebetween. A path including the metal region 55A and the wire 56 connects the power-stage differential amplifier circuit 32 and the switch 34S, and that path allows currents to flow in a direction crossing the interface where the first member 21 and the second member 22 are in surface contact with each other.

The pad 73 extends through a cavity in the interlayer insulating film 77 and is connected to the metal region 55B. The conductive protrusion 83 is connected to the switch 34S with the pad 73, metal region 55B, and a wire 54 inside the multilayer wiring structure 52 disposed therebetween. The conductive protrusion 83 is connected to the capacitor 34A mounted on the module substrate 25 (FIG. 4).

Next, advantageous effects of the second embodiment are described.

In the second embodiment, the power-stage differential amplifier circuit 32 in the second member 22 and the switch 34S in the first member 21 are connected without the use of the bonding wire. Therefore, the increase in parasitic inductance inserted in series with the switch 34S can be suppressed. Moreover, similarly to the first embodiment, the second embodiment can provide various effects, such as downsizing the radio-frequency power amplifier, suppressing the increase in manufacturing cost, and suppressing the temperature increase in the transistors 32T included in the power-stage differential amplifier circuit 32.

Third Embodiment

Next, a semiconductor module according to a third embodiment is described with reference to FIGS. 10 and 11. The semiconductor module according to the third embodiment is a radio-frequency power amplifier. The description of the configuration common to the semiconductor device according to the first embodiment described with reference to FIGS. 1 to 7B is omitted below.

Figure 10:
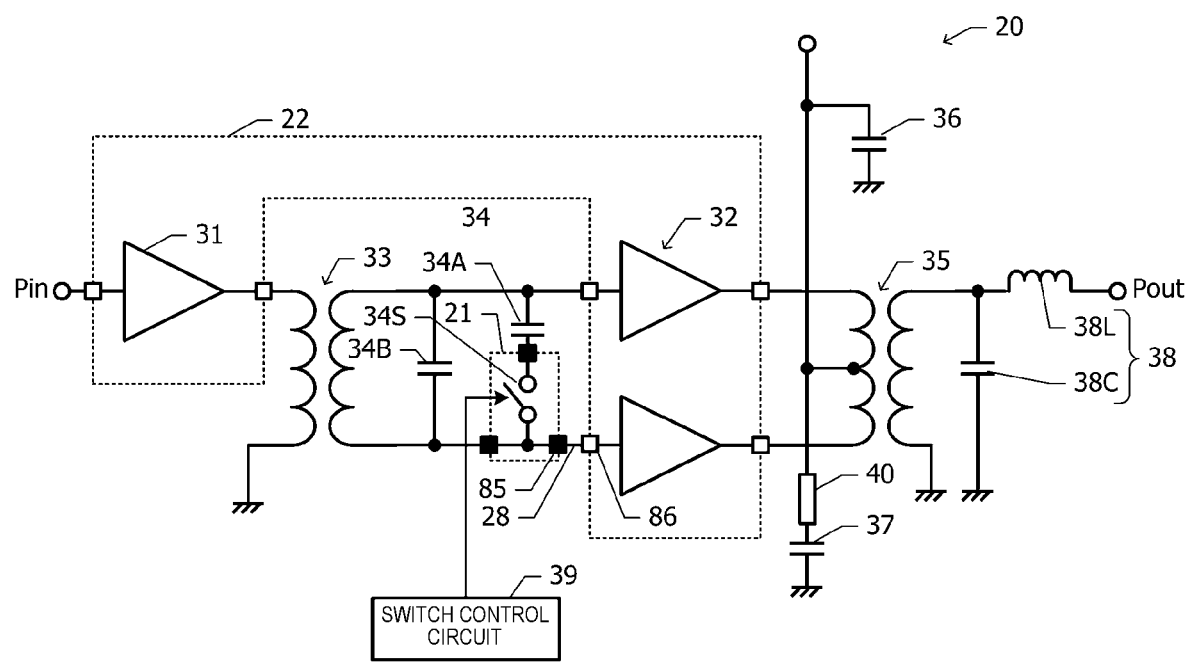
FIG. 10 is a schematic equivalent circuit diagram of a radio-frequency power amplifier according to a third embodiment.
Figure 11:
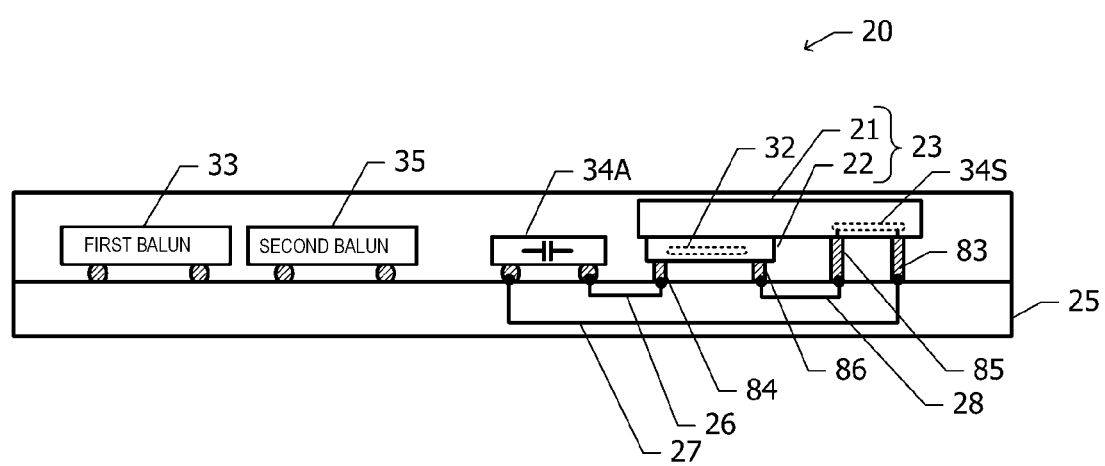
FIG. 11 is a schematic cross-sectional view of the radio-frequency power module according to the third embodiment.

FIG. 10 is a schematic equivalent circuit diagram of the radio-frequency power amplifier 20 according to the third embodiment. FIG. 11 is a schematic cross-sectional view of the radio-frequency power amplifier 20 according to the third embodiment. In the first embodiment (FIG. 1), the switch 34S and one input port of the power-stage differential amplifier circuit 32 are connected to each other with the inter-member connection wire 71 inside the redistribution layer disposed therebetween. In contrast to this, in the third embodiment, the switch 34S is connected to one input port of the power-stage differential amplifier circuit 32 with a conductive protrusion 85 on the first member 21, a wire 28 inside the module substrate 25, and a conductive protrusion 86 on the second member 22 disposed therebetween.

Next, advantageous effects of the third embodiment are described.

In the third embodiment, the power-stage differential amplifier circuit 32 in the second member 22 and the switch 34S in the first member 21 are connected without the use of the bonding wire. Therefore, the increase in parasitic inductance inserted in series with the switch 34S can be suppressed. Moreover, similarly to the first embodiment, the third embodiment can provide various effects, such as downsizing the radio-frequency power amplifier, suppressing the increase in manufacturing cost, and suppressing the temperature increase in the transistors 32T included in the power-stage differential amplifier circuit 32.

Fourth Embodiment

Next, a radio-frequency power amplifier according to a fourth embodiment is described with reference to FIG. 12. The description of the configuration common to the radio-frequency power amplifier according to the first embodiment described with reference to FIGS. 1 to 7B is omitted below.

Figure 12:
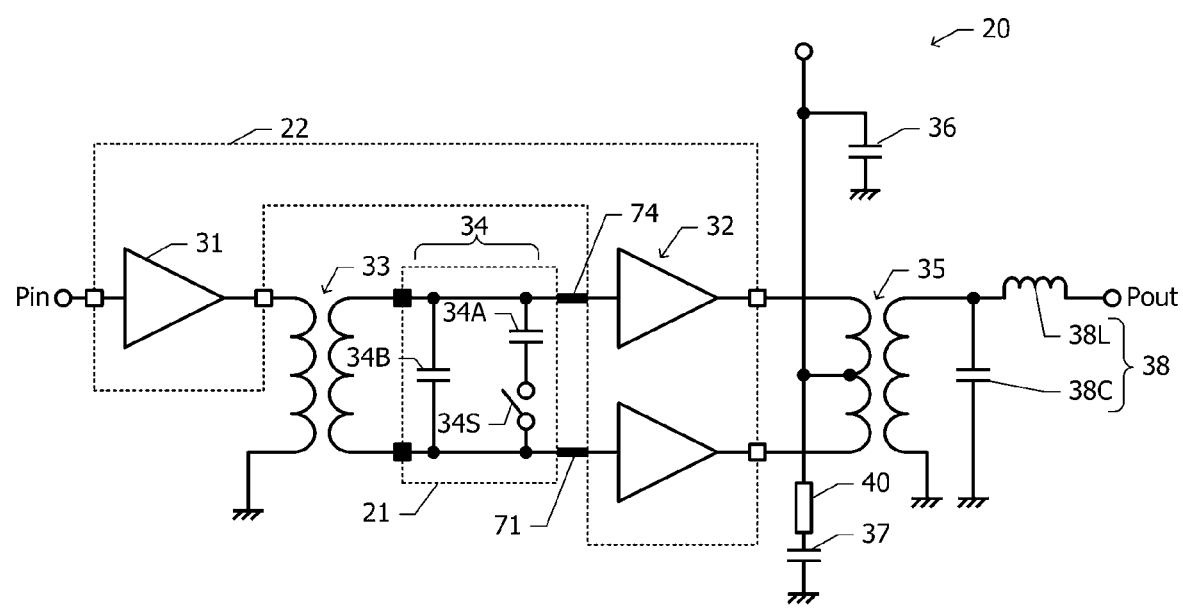
FIG. 12 is a schematic equivalent circuit diagram of a radio-frequency power amplifier according to a fourth embodiment.

FIG. 12 is a schematic equivalent circuit diagram of the radio-frequency power amplifier 20 according to the fourth embodiment. In the first embodiment (FIG. 1), the two capacitors 34A and 34B in the variable capacitance circuit 34 are passive components of the surface mount type mounted on the module substrate 25 (FIG. 4). In contrast to this, in the fourth embodiment, the two capacitors 34A and 34B are arranged inside the first member 21. For example, the capacitors 34A and 34B can be made of a metal pattern included in the wiring layer as the first layer and a metal pattern included in the wiring layer as the second layer inside the multilayer wiring structure 52 (FIG. 2) in the first member 21.

One electrode of each of the capacitors 34A and 34B arranged in the first member 21 is connected to one input port of the power-stage differential amplifier circuit 32 with an inter-member connection wire 74 included in the redistribution layer disposed therebetween.

Figure 13:
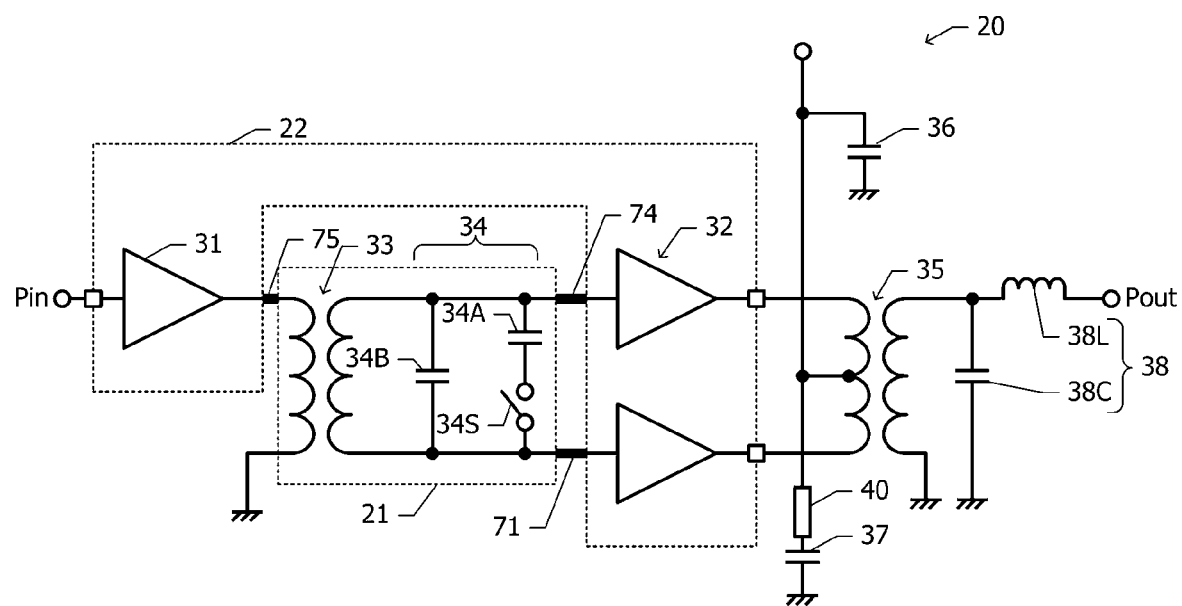
FIG. 13 is a schematic equivalent circuit diagram of a radio-frequency power amplifier according to a modification example of the fourth embodiment.
Figure 14:
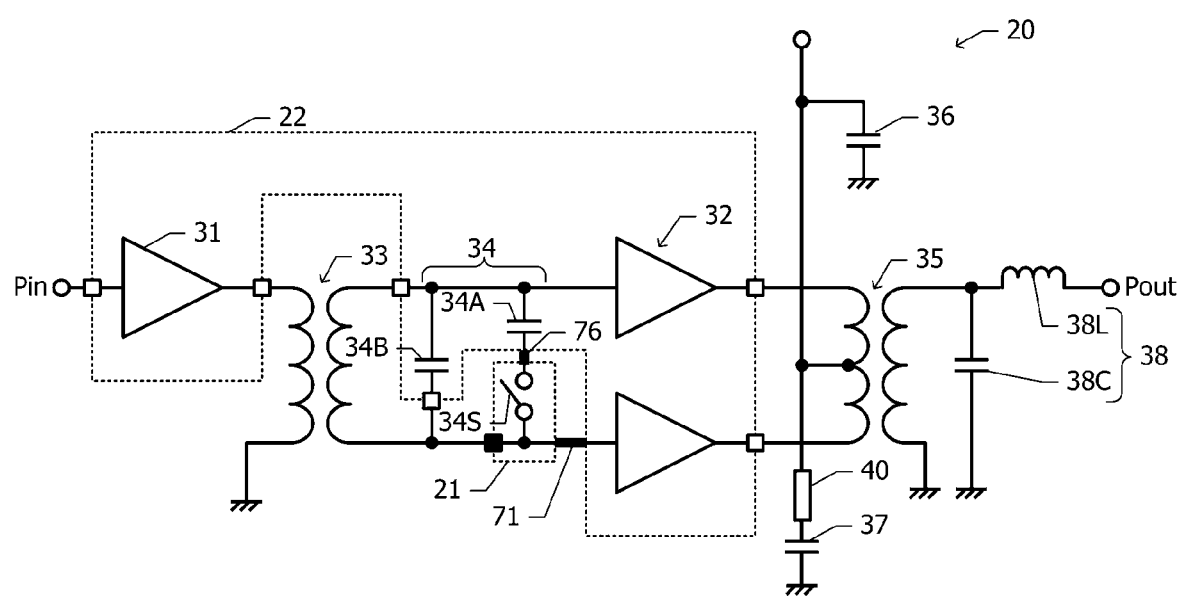
FIG. 14 is a schematic equivalent circuit diagram of a radio-frequency power amplifier according to another modification example of the fourth embodiment.
Figure 15:
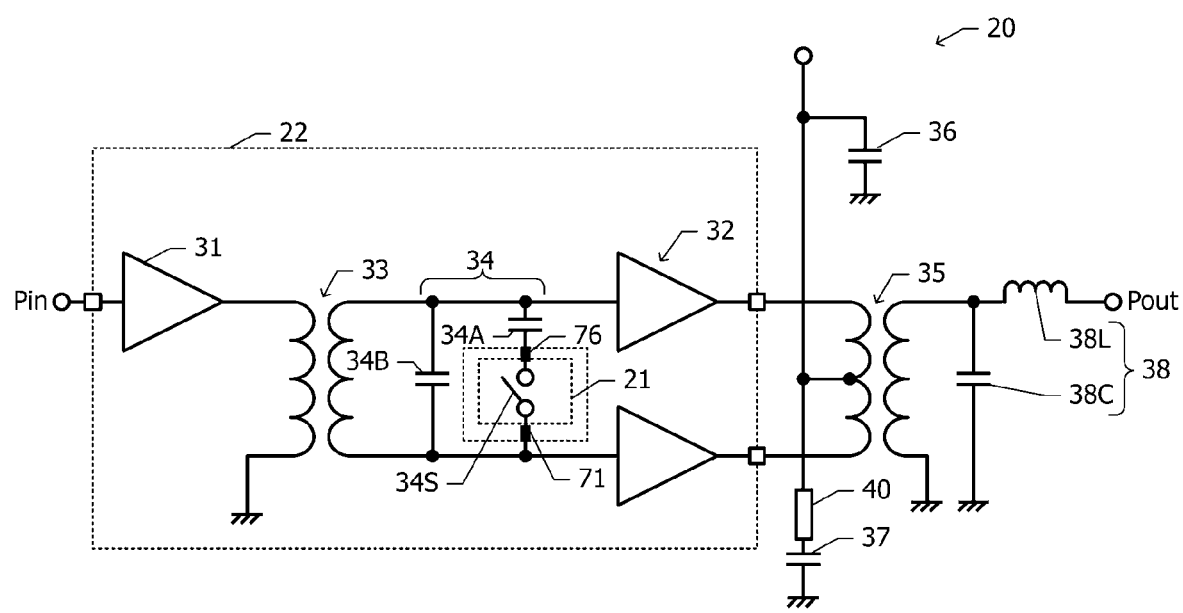
FIG. 15 is a schematic equivalent circuit diagram of a radio-frequency power amplifier according to still another modification example of the fourth embodiment.

Next, radio-frequency power amplifiers according to modification examples of the fourth embodiment are described with reference to FIGS. 13 to 15. FIGS. 13, 14, and 15 are schematic equivalent circuit diagrams of the radio-frequency power amplifiers 20 according to the modification examples of the fourth embodiment.

In the modification example illustrated in FIG. 13, in addition to the capacitors 34A and 34B, the first balun 33 is also arranged in the first member 21. One end of the primary coil in the first balun 33 is connected to the output port of the driver-stage amplifier circuit 31 in the second member 22 with an inter-member connection wire 75 included in the redistribution layer disposed therebetween.

In the modification example illustrated in FIG. 14, the two capacitors 34A and 34B are arranged in the second member 22. Similarly to, for example, the input capacitor Cin (FIG. 3B), the capacitors 34A and 34B can be made of a metal pattern included in the wiring layer as the first layer and a metal pattern included in the wiring layer as the second layer.

The switch 34S and the capacitor 34A are connected to each other with an inter-member connection wire 76 included in the redistribution layer disposed therebetween. The capacitors 34A and 34B are connected to the secondary coil in the first balun 33 with the conductive protrusions (hollow squares in FIG. 14) on the second member 22 disposed therebetween.

In the modification example illustrated in FIG. 15, in addition to the two capacitors 34A and 34B, the first balun 33 is also arranged in the second member 22. In one example, the primary coil and secondary coil in the first balun 33 can be made of a metal pattern included in the wiring layer as the first layer and a metal pattern included in the wiring layer as the second layer, respectively, in the second member 22 (FIG. 3B).

In other modification examples, each of the second balun 35 and the output matching circuit 38 may be arranged in the first member 21 or the second member 22.

Next, advantageous effects of the fourth embodiment and its modification examples are described.

As illustrated in the fourth embodiment and its modification examples, various circuit elements included in the radio-frequency power amplifier 20 may be made of metal patterns or the like included in the wiring layers inside the first member 21 or the second member 22, in place of the circuit components of the surface mount type mounted on the module substrate 25. When the circuit elements are arranged in the first member 21 or the second member 22, in comparison with the configuration where the circuit components of the surface mount type are used, the radio-frequency power amplifier 20 can be more downsized.

Conversely, as in the first embodiment, when various circuit elements are made of the circuit components of the surface mount type, in comparison with the configuration where the circuit elements are arranged inside the first member 21 or the second member 22, variations in the circuit constants of the passive elements can be more suppressed. Moreover, the increase in the number of wiring layers included in the multilayer wiring structure disposed in the first member 21 and the second member 22 can be suppressed. Whether various circuit elements in the radio-frequency power amplifier 20 are made of the circuit components of the surface mount type mounted on the module substrate 25 or are made of the metal patterns inside the first member 21 or the second member 22 may be determined in accordance with desired specifications of the radio-frequency power amplifier 20.

Fifth Embodiment

Next, a radio-frequency power amplifier according to a fifth embodiment is described with reference to FIG. 16. The description of the configuration common to the radio-frequency power amplifier according to the first embodiment described with reference to FIGS. 1 to 7B is omitted below.

Figure 16:
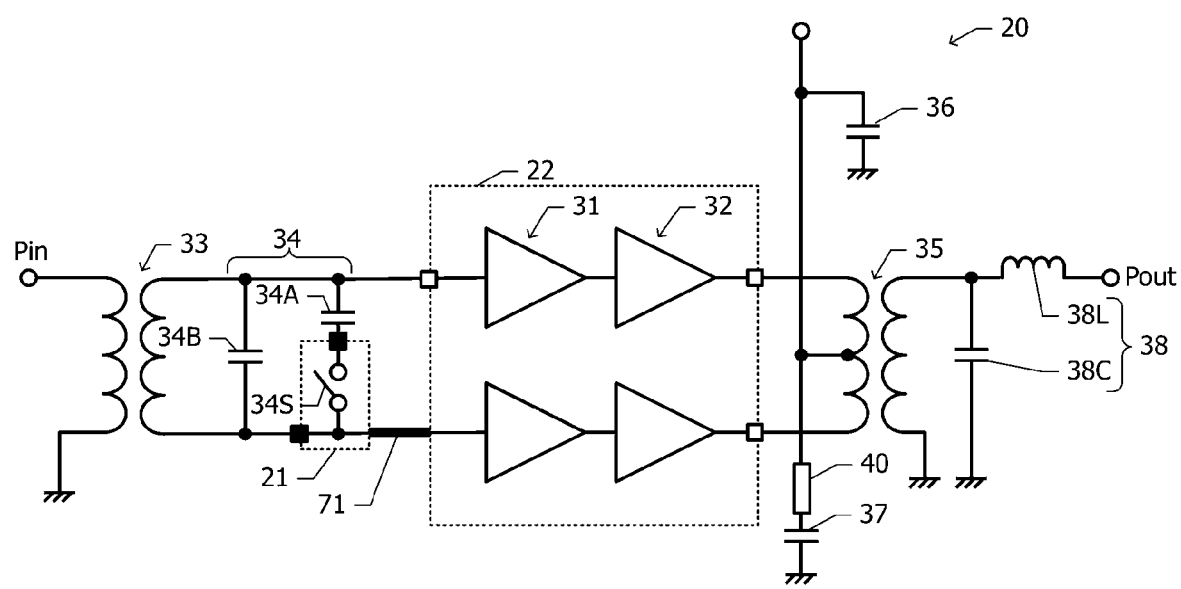
FIG. 16 is a schematic equivalent circuit diagram of a radio-frequency power amplifier according to a fifth embodiment.

FIG. 16 is a schematic equivalent circuit diagram of the radio-frequency power amplifier 20 according to the fifth embodiment. In the first embodiment (FIG. 1), as the driver-stage amplifier circuit 31, the amplifier circuit for single-end signals is used. In contrast to this, in the fifth embodiment, as the driver-stage amplifier circuit 31, similarly to the power-stage one, a differential amplifier circuit is used.

In the first embodiment (FIG. 1), the first balun 33 and the variable capacitance circuit 34 are disposed between the driver-stage amplifier circuit 31 and the power-stage differential amplifier circuit 32. In the fifth embodiment, the first balun 33 and the variable capacitance circuit 34 are connected to the input side of the driver-stage amplifier circuit 31. Differential signals converted from single-end signals by the first balun 33 are input into the two input ports of the driver-stage amplifier circuit 31. One input port of the driver-stage amplifier circuit 31 and the switch 34S are connected to each other by the inter-member connection wire 71 inside the redistribution layer.

Next, advantageous effects of the fifth embodiment are described.

In the fifth embodiment, the driver-stage amplifier circuit 31 in the second member 22 and the switch 34S in the first member 21 are connected without the use of the bonding wire. Therefore, the increase in parasitic inductance inserted in series with the switch 34S can be suppressed. Moreover, similarly to the first embodiment, the fifth embodiment can provide various effects, such as downsizing the radio-frequency power amplifier, suppressing the increase in manufacturing cost, and suppressing the temperature increase in the transistors 32T in the power-stage differential amplifier circuit 32.

The embodiments described above are examples, and as might be expected, the configurations described in the different embodiments may be replaced or combined in part. Almost identical actions and effects achieved by almost identical configurations in the plurality of embodiments are not mentioned in every embodiment. Moreover, the present disclosure is not limited to the embodiments described above. For example, various changes, improvements, and combinations would be apparent to those skilled in the art.

What is claimed is:

1. A semiconductor device comprising:
   a first member including a switch made of a semiconductor element made from an elemental semiconductor;
   a second member including a radio-frequency circuit including a semiconductor element made from a compound semiconductor, the second member joined to the first member; and
   a path connecting the switch and the radio-frequency circuit,
   wherein the path includes an inter-member connection wire made of a metal pattern arranged on an interlayer insulating film extending from a surface of the second member to a surface of the first member or a conductive member allowing a current to flow across a surface joining the first member and the second member.

2. The semiconductor device according to claim 1, wherein
   the radio-frequency circuit includes a differential amplifier circuit, and
   the semiconductor device further comprises a variable capacitance circuit connected between a pair of wires, the variable capacitance circuit being configured to allow transmission of a differential signal into the differential amplifier circuit, the variable capacitance circuit includes a capacitor and the switch, and capacitance between the pair of the wires is changed by turning on or off of the switch.

3. The semiconductor device according to claim 2, wherein
   the capacitor included in the variable capacitance circuit is disposed in the first member.

4. The semiconductor device according to claim 2, further comprising:
   a first balun configured to convert a single-end signal into a differential signal to be input into the differential amplifier circuit; and
   a second balun configured to convert a differential signal output from the differential amplifier circuit into a single-end signal.

5. The semiconductor device according to claim 4, wherein
   the first balun and the second balun are disposed in the first member.

6. The semiconductor device according to claim 4, further comprising:
   a driver-stage amplifier circuit configured to output a single-end signal to be input into the first balun.

7. The semiconductor device according to claim 4, further comprising:
   a power-stage differential amplifier circuit configured to amplify a signal output from the differential amplifier circuit and output a differential signal to be input into the second balun.

8. The semiconductor device according to claim 5, further comprising:
   a driver-stage amplifier circuit configured to output a single-end signal to be input into the first balun.

9. The semiconductor device according to claim 5, further comprising:
   a power-stage differential amplifier circuit configured to amplify a signal output from the differential amplifier circuit and output a differential signal to be input into the second balun.

10. A semiconductor module comprising:
    a semiconductor device including a first member including a switch made of a semiconductor element made from an elemental semiconductor and a second member including a radio-frequency circuit including a semiconductor element made from a compound semiconductor, the second member joined to the first member, the semiconductor device further including a first conductive protrusion connected to the switch and a second conductive protrusion connected to the radio-frequency circuit;
    a module substrate on which the semiconductor device is mounted; and
    a path connecting the switch and the radio-frequency circuit, the path including the first conductive protrusion, a wire disposed on the module substrate, and the second conductive protrusion.

11. The semiconductor module according to claim 10, wherein
    the radio-frequency circuit includes a differential amplifier circuit, and
    the semiconductor module further comprises a variable capacitance circuit connected between a pair of wires, the variable capacitance circuit being configured to allow transmission of a differential signal into the differential amplifier circuit, the variable capacitance circuit includes a capacitor and the switch, and capacitance between the pair of the wires is changed by turning on or off of the switch.

12. The semiconductor module according to claim 11, wherein
    the capacitor included in the variable capacitance circuit is disposed in the first member.

13. The semiconductor module according to claim 11, further comprising:
    a first balun configured to convert a single-end signal into a differential signal to be input into the differential amplifier circuit; and
    a second balun configured to convert a differential signal output from the differential amplifier circuit into a single-end signal.

14. The semiconductor module according to claim 13, wherein
    the first balun and the second balun are disposed in the first member.

15. The semiconductor module according to claim 13, further comprising:
    a driver-stage amplifier circuit configured to output a single-end signal to be input into the first balun.

16. The semiconductor module according to claim 13, further comprising:
    a power-stage differential amplifier circuit configured to amplify a signal output from the differential amplifier circuit and output a differential signal to be input into the second balun.

17. The semiconductor module according to claim 14, further comprising:

a driver-stage amplifier circuit configured to output a single-end signal to be input into the first balun.

18. The semiconductor module according to claim 14, further comprising:
a power-stage differential amplifier circuit configured to amplify a signal output from the differential amplifier circuit and output a differential signal to be input into the second balun.

* * * * *